United States Patent [19]

Perduijn et al.

[11] 4,355,256

[45] Oct. 19, 1982

[54] CERAMIC COMPOSITION FOR A PIEZOELECTRIC BODY AND ELECTROMECHANICAL TRANSDUCER

[75] Inventors: David J. Perduijn; Jacobus Verberkt, both of Eindhoven, Netherlands

[73] Assignee: U.S. Philips Corporation, New York, N.Y.

[21] Appl. No.: 149,784

[22] Filed: May 14, 1980

[30] Foreign Application Priority Data

May 21, 1979 [NL] Netherlands ............... 7903964

[51] Int. Cl.$^3$ .......................................... H01L 41/08
[52] U.S. Cl. ................................. 310/358; 252/62.9
[58] Field of Search ........................... 310/357–359, 310/311; 252/62.9

[56] References Cited

U.S. PATENT DOCUMENTS 2,906,710 9/1959 Kulcsar et al. ............... 310/358 X
3,671,765 6/1972 Hardtl ........................... 310/358 X

*Primary Examiner*—Mark O. Budd

*Attorney, Agent, or Firm*—Norman N. Spain

[57] ABSTRACT

Piezoelectric body for an electromechanical transducer consisting of $Pb_{1-a}M_a(Mg_{(1-b)/3}Mn_{b/3}Sb_{2/3})_x Ti_yZr_zO_3$, wherein M is one or more of the alkaline earth metals Ca, Sr and Ba, $0 \leq a \leq 0.15$, $0 \leq b \leq 0.20$, $0.01 \leq x \leq 0.25$, $0.40 \leq y \leq 0.55$, $0.20 \leq z \leq 0.59$, $(x+y+z)=1$.

This material has the advantage that polarization is effected in a very short period of time at room temperature.

2 Claims, 3 Drawing Figures

CERAMIC COMPOSITION FOR A PIEZOELECTRIC BODY AND ELECTROMECHANICAL TRANSDUCER

BACKGROUND OF THE INVENTION

The invention relates to a piezoelectric body for an electromechanical transducer comprising a ceramic piezoelectric material.

This type of ceramic material is based on the system PbTiO$_3$-PbZrO$_3$, which system is known from U.S. Pat. No. 2,708,244. A number of improvements have been developed from on this basic system, depending on the intended use of the material, making certain additives to the lead titanate zirconate.

An improved material is inter alia described in U.S. Pat. No. 3,268,453, this material having a composition within the ternary system PbTiO$_3$—PbZrO$_3$—Pb(Mg$_{1/3}$Nb$_{2/3}$)O$_3$ of the perowskite system. Distinctive features of this material are a relatively high dielectric constant and a high piezoelectric response.

Such a ceramic body, obtained by sintering a starting mixture must be polarised to make it suitable for use as a piezoelectric transducer, that is to say the elementary electric dipoles must be irreversibly oriented in an electric field.

Most known materials of this type have the drawback that polarisation must be effected at an elevated temperature, namely at a temperature between 100° and 200° C., and/or for a long period of time (°1 hour), in an electrically non-conductive oil at a field strength of 1.5-4 MV/m.

SUMMARY OF THE INVENTION

The piezoelectric body for an electromechanical transducer on the basis of the ternary system lead titanate–lead zirconate and a lead compound of this type, wherein part of the total Ti and Zr has been replaced by ⅓ mole of a bivalent metal and by ⅔ mole of a pentavalent metal, is characterized according to the invention in that it consists of Pb$_{1-a}$M$_a$(Mg$_{(1-b)/3}$Mn$_{b/3}$Sb$_{2/3}$)$_x$ Ti$_y$Zr$_z$O$_3$, wherein M is one or more of the alkaline earth metals Ca, Sr and Ba, $0 \leq a \leq 0.15$, $0 \leq b \leq 0.20$, $0.01 \leq x \leq 0.25$, $0.40 \leq y \leq 0.55$, $0.20 \leq z \leq 0.59$ and
$(x+y+z)=1$.

According to the invention there is provided a piezoelectric material having a composition within a range wherein a formed body consisting of this material can as a rule be polarised in a very short period of time (between 1 sec. and 5 min.) at room temperature so as to produce polarized bodies having good piezoelectric properties. In addition, the material according to the invention has the advantage that the piezoelectric properties have a satisfactory stability as a function of the temperature and the time, in spite of the short polarisation time. The piezoelectric response changes only slightly up to 100° C. and has a good stability with time.

The feature that polarisation can be effected at room temperature has the important advantage that the piezoelectric body can be built into an assembly and that this assembly may then be subjected to the polarisation treatment.

Such an assembly may be made made, for example by securing the piezoelectric body to a membrane with an adhesive which is cured at an elevated temperature (>150° C.), or by soldering the piezoelectric body to a substrate. The fact that polarisation is not effected until after the assembly is room temperature prevents the piezoelectric properties of the body from degenerating by reason of the polarized body being heated to the high temperature at which the body is attached.

According to an elaboration of the invention, a further improvement of the properties is accomplished by replacing up to a total of 15 mol.% of Pb equimolarly by one or more of the alkaline earth metals Ca, Sr and Ba.

A reduction in the loss factor (tan δ) is accomplished by replacing up to 20 mol.% of the Mg by Mn. This is advantageous for some applications, A further range of compositions is found between the boundaries:

$x=0.125-0.15$ $y=0.44-0.46$ and $z=0.38-0.44$, in a composition of the general formula Pb$_{1-a}$Sr$_a${(Mg$_{1-b}$Mn$_b$)$_{1/3}$Sb$_{2/3}$}$_x$Ti$_y$Zr$_z$O$_3$
in which a (=the molar fraction of Sr) is 0.05 and b is the molar fraction of Mn. These compositions can be polarised at room temperature within 1 sec. They are suitable for low-power uses, having a high sensitivity and a high piezoelectric response, and are therefore particularly suitably for use in buzzers, smoke detectors and high-frequency loudspeakers.

DESCRIPTION OF THE PREFERRED EMBODIMENTS

Figure 1:
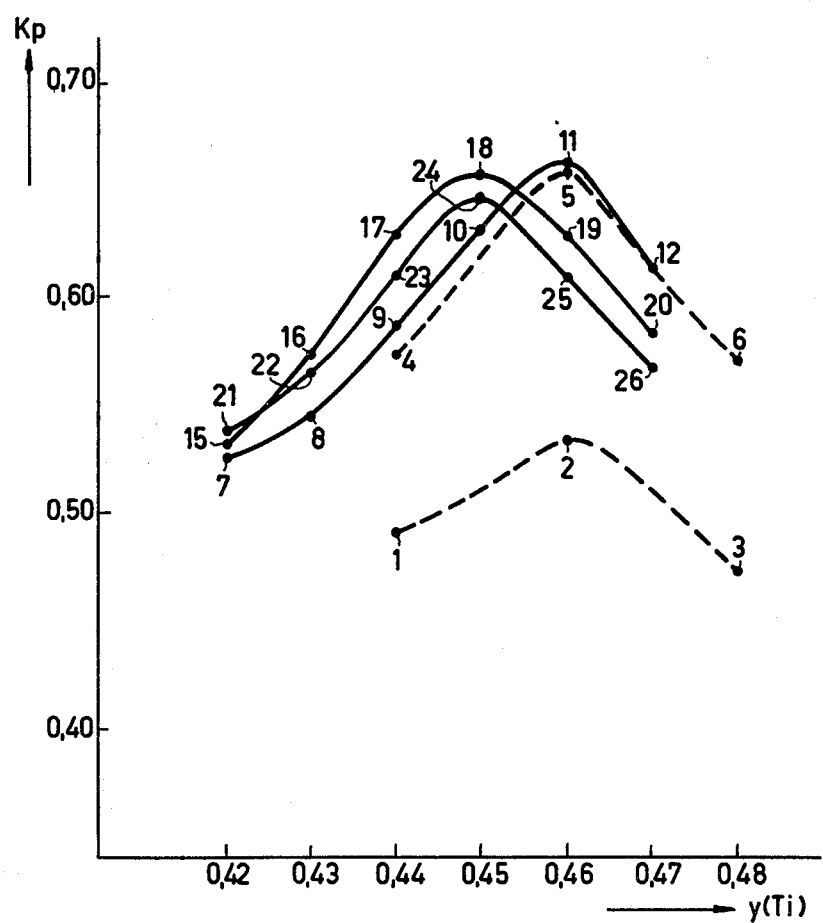
FIG. 1 is a graph showing the planar coupling coefficient as a function the Ti content.
Figure 2:
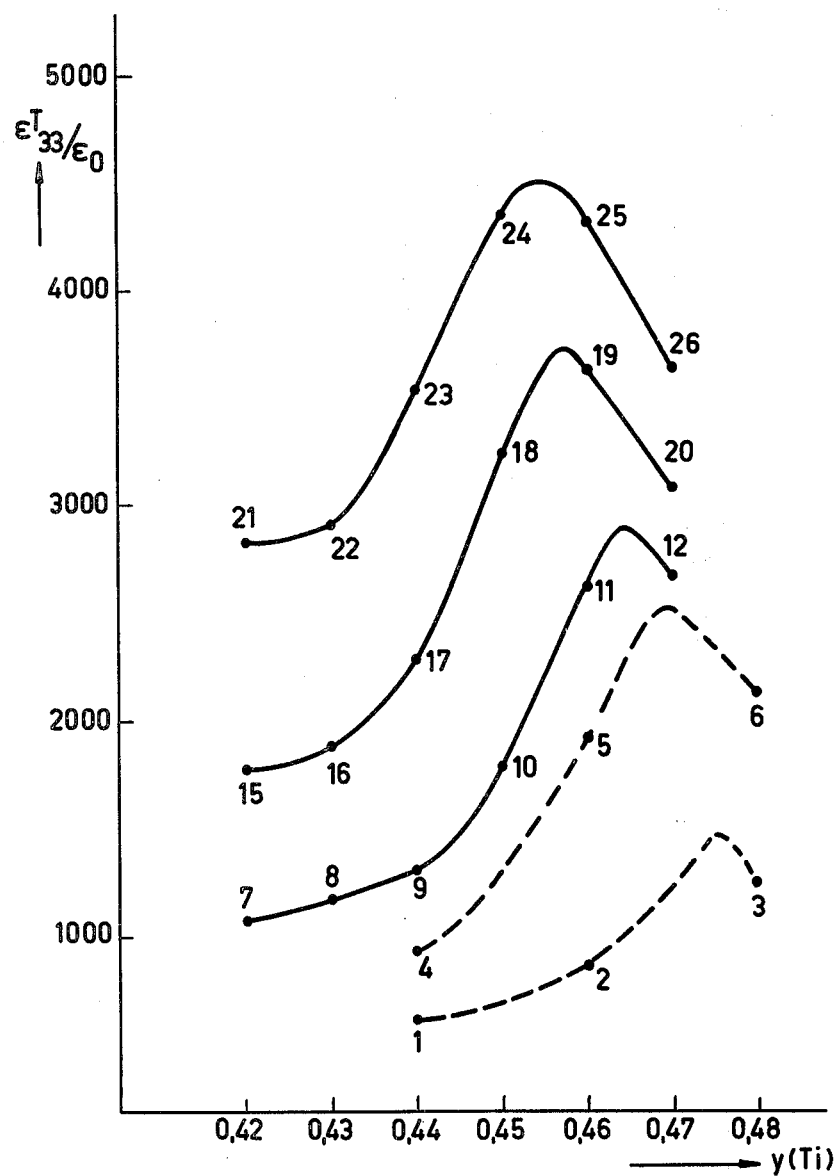
FIG. 2 is a graph showing the dielectric constant as a function the Ti content and, FIG. 3 is a graph showing the charge constant as a function of the Ti content.
Figure 3:
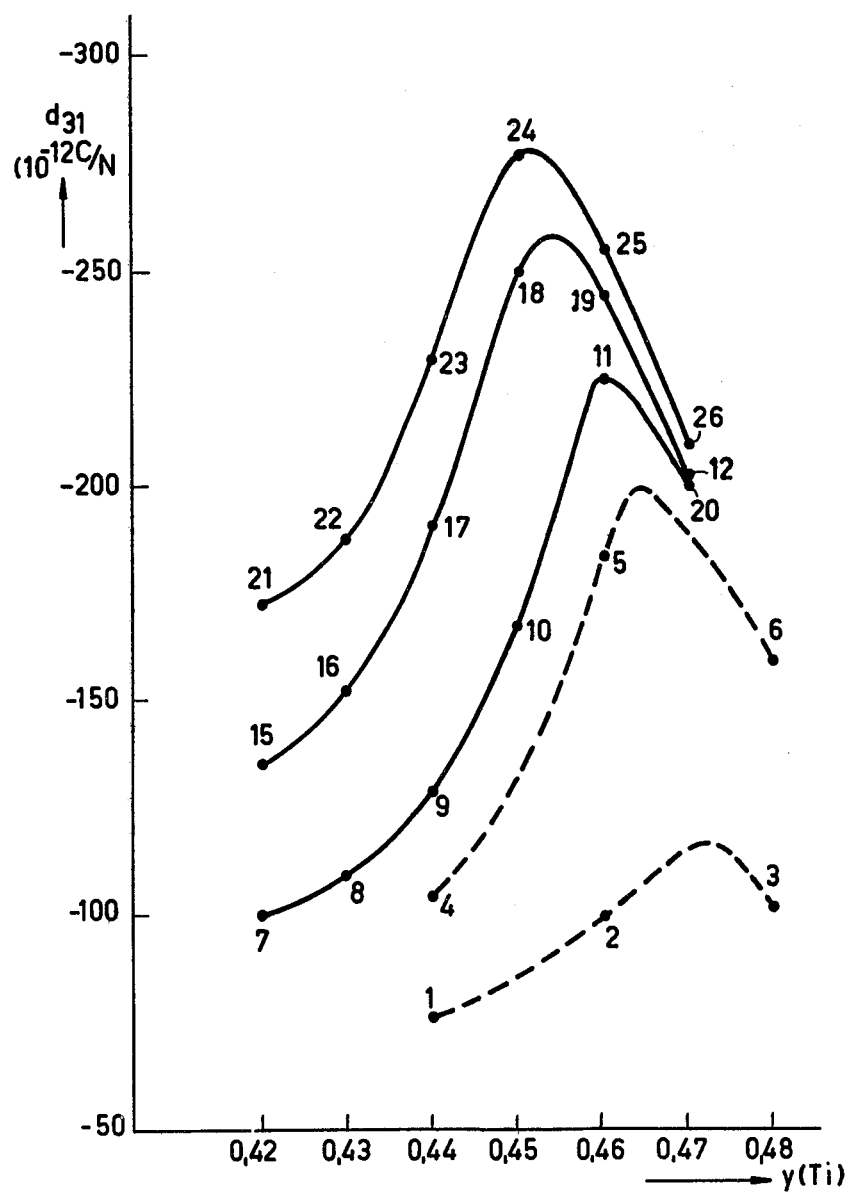

The invention will now be further illustrated with reference to a number of embodiments.

The starting materials, namely lead oxide (PbO), magnesium oxide (MgO), antimony pentoxide (Sb$_2$O$_5$), titanium dioxide (TiO$_2$) and zirconium dioxide (ZrO$_2$), and, if necessary, SrO, BaO, CaO and/or MnO$_2$, all these materials being of a chemically pure quality, are mixed with distilled water in a rubber-lined ball mill.

After wet-milling, the mixture is dried. Thereafter the mixture is subjected to a first reaction by heating the mixture for 2 hours at a temperature of approximately 850° C. in an oxygen atmosphere.

The material is thereafter allowed to cool, whereafter it is milled again. The powder thus obtained is then compressed to form cylinders having a diameter of 15 mm and a height of 20 mm, using a pressure of 70 MPa and the cylinders are sintered for 45 minutes at 1150°-1300° C., depending on the composition, in an oxygen atmosphere, in a container formed at a refractory material, to prevent evaporation of lead. After cooling the cylinders are reduced to 12 mm by grinding the ground cylinders and are cut into discs of 1 mm thick.

After having been provided with electrodes, the discs are polarised in air or in silicone oil for 1 sec. to 5 minutes at a temperature between 20° and 200° C. depending on the composition, in a field of 1-3 MV/m.

The following Table I shows a number of compositions within the range according to the invention with a number of physical properties, namely the density $\Lambda_s$, the dielectric constant $\epsilon_{33}^T/\epsilon_O$, the dielectric loss factor tan δ, the planar coupling coefficient $k_p$, the frequency constant $N_p$ and the charge constant $d_{31}$.

Table II illustrates the time stability and the temperature stability, measured 24 hours after composition 18 of Table I had been subjected to a temperature treatment at 100° C. for 1 hour.

The Figures illustrate the above-mentioned quantities as a function of the Ti-content, the numbers of the points in the Figures corresponding to the respective numbered compositions listed in Table I.

TABLE I

General formula $Pb_{1-a}Sr_a\{(Mg_{1-b}Mn_b)_{\frac{1}{3}}Sb_{\frac{2}{3}}\}_xTi_yZr_zO_3$

| | Molar ratio of basic composition | | | substituents | | | 24 hours after polarizing | | | | |
|---|---|---|---|---|---|---|---|---|---|---|---|
| Ex. no. | (PbMg$_{\frac{1}{3}}$Sb$_{\frac{2}{3}}$O$_3$) x | (PbTiO$_3$) y | (PbZrO$_3$) z | (Sr) a | (Mn) b | $\rho_s$ (g/cm$^3$) | $\epsilon_{33}^T/\epsilon_O$ at 1kHz | tan δ at 1kHz (× 10$^{-4}$) | $k_p$ | $N_p$ (Hz.m) | $d_{31}$ (10$^{-12}$ C/N) |
| 1 | 0.05 | 0.44 | 0.51 | 0 | 0 | 7.77 | 625 | 165 | 0.491 | 2210 | −76 |
| 2 | 0.05 | 0.46 | 0.49 | 0 | 0 | 7.77 | 880 | 138 | 0.533 | 2180 | −99 |
| 3 | 0.05 | 0.48 | 0.47 | 0 | 0 | 7.77 | 1250 | 104 | 0.473 | 2210 | −103 |
| 4 | 0.125 | 0.44 | 0.435 | 0 | 0 | 8.06 | 950 | 166 | 0.573 | 2260 | −104 |
| 5 | 0.125 | 0.46 | 0.415 | 0 | 0 | 8.06 | 1950 | 141 | 0.658 | 2060 | −189 |
| 6 | 0.125 | 0.48 | 0.395 | 0 | 0 | 8.06 | 2150 | 109 | 0.570 | 2230 | −158 |
| 7 | 0.125 | 0.42 | 0.455 | 0.02 | 0 | 8.00 | 1085 | 201 | 0.526 | 2335 | −100 |
| 8 | 0.125 | 0.43 | 0.445 | 0.02 | 0 | 8.00 | 1185 | 196 | 0.544 | 2295 | −109 |
| 9 | 0.125 | 0.44 | 0.435 | 0.02 | 0 | 8.00 | 1310 | 180 | 0.589 | 2230 | −128 |
| 10 | 0.125 | 0.45 | 0.425 | 0.02 | 0 | 8.00 | 1795 | 171 | 0.628 | 2125 | −168 |
| 11 | 0.125 | 0.46 | 0.415 | 0.02 | 0 | 8.01 | 2620 | 165 | 0.663 | 2026 | −225 |
| 12 | 0.125 | 0.47 | 0.405 | 0.02 | 0 | 8.00 | 2675 | 141 | 0.613 | 2115 | −201 |
| 13 | 0.125 | 0.40 | 0.475 | 0.05 | 0 | 7.92 | 1535 | 219 | 0.514 | 2340 | −116 |
| 14 | 0.125 | 0.41 | 0.465 | 0.05 | 0 | 7.91 | 1590 | 211 | 0.525 | 2305 | −123 |
| 15 | 0.125 | 0.42 | 0.455 | 0.05 | 0 | 7.90 | 1780 | 230 | 0.533 | 2255 | −135 |
| 16 | 0.125 | 0.43 | 0.445 | 0.05 | 0 | 7.91 | 1865 | 200 | 0.573 | 2210 | −151 |
| 17 | 0.125 | 0.44 | 0.435 | 0.05 | 0 | 7.91 | 2285 | 200 | 0.629 | 2115 | −192 |
| 18 | 0.125 | 0.45 | 0.425 | 0.05 | 0 | 7.91 | 3245 | 210 | 0.657 | 2030 | −249 |
| 19 | 0.125 | 0.46 | 0.415 | 0.05 | 0 | 7.90 | 3625 | 180 | 0.629 | 2085 | −245 |
| 20 | 0.125 | 0.47 | 0.405 | 0.05 | 0 | 7.89 | 3080 | 147 | 0.583 | 2195 | −199 |
| 21 | 0.15 | 0.42 | 0.43 | 0.05 | 0 | 7.95 | 2835 | 257 | 0.537 | 2220 | −173 |
| 22 | 0.15 | 0.43 | 0.42 | 0.05 | 0 | 7.96 | 2910 | 258 | 0.564 | 2175 | −188 |
| 23 | 0.15 | 0.44 | 0.41 | 0.05 | 0 | 7.95 | 3555 | 290 | 0.610 | 2115 | −231 |
| 24 | 0.15 | 0.45 | 0.40 | 0.05 | 0 | 7.96 | 4345 | 293 | 0.646 | 2060 | −278 |
| 25 | 0.15 | 0.46 | 0.39 | 0.05 | 0 | 7.96 | 4305 | 233 | 0.609 | 2110 | −255 |
| 26 | 0.15 | 0.47 | 0.38 | 0.05 | 0 | 7.96 | 3650 | 180 | 0.567 | 2200 | −209 |
| 27 | 0.175 | 0.42 | 0.405 | 0.05 | 0 | 7.98 | 5730 | 545 | 0.358 | 2385 | −153 |
| 28 | 0.175 | 0.43 | 0.395 | 0.05 | 0 | 7.98 | 5715 | 530 | 0.428 | 2325 | −187 |
| 29 | 0.175 | 0.44 | 0.385 | 0.05 | 0 | 7.96 | 5325 | 355 | 0.555 | 2200 | −248 |
| 30 | 0.175 | 0.46 | 0.365 | 0.05 | 0 | 7.98 | 5030 | 420 | 0.427 | 2294 | −177 |
| 31 | 0.20 | 0.42 | 0.38 | 0.05 | 0 | 7.96 | 5855 | 570 | 0.235 | 2495 | −97 |
| 32 | 0.20 | 0.43 | 0.37 | 0.05 | 0 | 7.96 | 5910 | 570 | 0.280 | 2450 | −118 |
| 33 | 0.20 | 0.44 | 0.36 | 0.05 | 0 | 7.97 | 5950 | 580 | 0.363 | 2380 | −158 |
| 34 | 0.20 | 0.45 | 0.35 | 0.05 | 0 | 7.98 | 5920 | 460 | 0.450 | 2300 | −202 |
| 35 | 0.20 | 0.46 | 0.34 | 0.05 | 0 | 7.98 | 5500 | 330 | 0.494 | 2265 | −217 |
| 36 | 0.20 | 0.47 | 0.33 | 0.05 | 0 | 7.98 | 4655 | 230 | 0.499 | 2280 | −201 |
| 37 | 0.125 | 0.45 | 0.425 | 0.05 | 0 | 7.93 | 3230 | 197 | 0.668 | 1995 | −256 |
| 38 | 0.125 | 0.45 | 0.425 | 0.05 | 0.05 | 7.93 | 3130 | 130 | 0.659 | 2020 | −246 |
| 39 | 0.125 | 0.45 | 0.425 | 0.05 | 0.10 | 7.95 | 2850 | 68 | 0.656 | 2060 | −229 |
| 40 | 0.125 | 0.45 | 0.425 | 0.05 | 0.20 | 7.93 | 2210 | 29 | 0.638 | 2150 | −188 |

TABLE II

| | time stability (% per decade) polarizing temperature | | temperature stability (% per decade) polarizing temperature | |
|---|---|---|---|---|
| | 25° C. | 150° C. | 25° C. | 150° C. |
| $\epsilon_{33}^T/\epsilon_O$ | −1.8 | −0.6 | +16 | +14 |
| $K_p$ | −0.7 | −0.4 | −2.3 | −3.4 |
| $N_p$ | +0.15 | +0.1 | +0.15 | 0 |
| $d_{31}$ | −2.5 | −0.8 | +4.7 | +3.7 |

What is claimed is:

1. A piezoelectric body for an electromechanical transducer corresponding to the ternary system lead titanate-lead zirconate-$Pb(M_{1/3}^{II}M_{2/3}^{V})O_3$, characterized in that said piezoelectric body consists of $Pb_{1-a}M_a(Mg_{(1-b)/3}Mn_{b/3}Sb_{2/3})_xTi_yZr_zO_3$ wherein M is one or more of the alkaline earth metals Ca, Sr and Ba and wherein, $0 \leq a \leq 0.15$, $0 \leq b \leq 0.20$, $0.01 \leq x \leq 0.25$, $0.40 \leq y \leq 0.55$, $0.20 \leq z \leq 0.59$ and $(x+y+z) = 1$.

2. A body as claimed in claim 1, characterized in that $0.125 \leq x \leq 0.15$, $0.44 \leq y \leq 0.46$ and $0.38 \leq z \leq 0.44$, while the molar fraction of Sr is 0.05.

* * * * *